United States Patent
Chen et al.

[11] Patent Number: 6,110,810
[45] Date of Patent: Aug. 29, 2000

[54] PROCESS FOR FORMING N-CHANNEL THROUGH AMORPHOUS SILICON (αSI) IMPLANTATION MOS PROCESS

[75] Inventors: Chien-Hung Chen, Taipei; Keng-Hui Liao, PingTung; Martin Lin, ChiaYi, all of Taiwan

[73] Assignee: Mosel Vitelic Inc., Hsinchu, Taiwan

[21] Appl. No.: 09/108,977

[22] Filed: Jul. 2, 1998

[30] Foreign Application Priority Data

Apr. 24, 1998 [TW] Taiwan ................................. 87106313

[51] Int. Cl.[7] .................................................. H01L 21/28
[52] U.S. Cl. ........................................... 438/582; 438/582
[58] Field of Search .................................... 438/197, 217, 438/289, 290, 291, 514, 532, 582, 592; 437/40, 46; 257/650, 758

[56] References Cited

U.S. PATENT DOCUMENTS

| | | | |
|---|---|---|---|
| 5,460,986 | 10/1995 | Tam et al. ................................ | 437/40 |
| 5,508,555 | 4/1996 | Brotherton et al. .................... | 257/650 |
| 5,637,187 | 6/1997 | Takasu et al. ............................ | 438/30 |
| 5,698,901 | 12/1997 | Endo ........................................ | 257/758 |
| 5,712,181 | 1/1998 | Byun et al. .............................. | 437/46 |
| 5,918,129 | 6/1999 | Fulford, Jr. et al. .................... | 438/289 |
| 5,980,763 | 11/1999 | Young ....................................... | 216/23 |

Primary Examiner—David Nelms
Assistant Examiner—David Nhu
Attorney, Agent, or Firm—Bacon & Thomas

[57] ABSTRACT

A method of forming channel for metal oxidation semiconductor in the integrated circuits. The manufacturing process is as following: a layer of amorphous silicon is deposited after forming the gate oxide, and ion implantation for forming channel is performed, then a doped polysilicon layer and a silicide layer are deposited orderly, finally the whole structure is defined to form a gate electrode. The key point of the current invention is the addition of amorphous silicon. This amorphous silicon can prevent the direct bombardment of implanted ions to the gate oxide, it can also avoid the diffusion of polysilicon dopant into the gate oxide, therefore, the electrical properties of transistor will be made stable. In addition, the native oxide spontaneously produced between amorphous silicon and polysilicon along with process is very even and plain, it is profitable to planarization when subsequently depositing other layers.

17 Claims, 2 Drawing Sheets

PROCESS FOR FORMING N-CHANNEL THROUGH AMORPHOUS SILICON (αSI) IMPLANTATION MOS PROCESS

BACKGROUND OF THE INVENTION

1. Field of the Invention

This invention relates to a semiconductor manufacturing technology and, more particularly, to a method of forming channels for metal-oxide-semiconductor (MOS) field effect transistors (FETs).

2. Description of the Prior Art

So called integrated circuit is an electrical technology which could shrink the size of a designed set including at least several hundred electrical devices, such as resistors, capacitors and insulators to a feature size as small as 0.18 micrometers by methods of film deposition, lithography, etching etc in today's technology.

One of the most commonly used FET structure is MOS which composed of three different materials—metal, oxide, and semiconductor. The interface of metal and oxide is named the gate electrode or gate, and two regions with opposite polarity to that of the semiconductor are named individually "source" and "drain". The operating principle of MOS is that while no external voltage is biased, source and drain act like a back-to-back p-n junction and only little leakage current is permitted to flow from between each other. However, while a forward bias greater than so-called threshold voltage is put on the gate, inversion of the MOS structure causes producing a surface inversion region, so that the originally isolated source and drain become conducted. This surface inversion region is called "channel" which is able to provide conduction of large current, and the initial voltage resulting in the inversion effect is called the threshold voltage ($V_T$).

The threshold voltage which is an important parameter in MOS operation can be controlled by adjusting, for example, the dopping density of the channel, the thickness of the gate oxide, or the forward bias to the substrate. However, among all these approaches, the most effective one is to adjust the dopping density of the substrate that could be controlled precisely through the method such as ion implantation.

The conventional way to regulate the threshold voltage is by operating ion plantation to the substrate after the gate oxide is formed. Taking an example of NMOS transistor, p-type impurity is usually used to be doped into a p-type substrate, then polysilicon and silicide as the metal layer of the transistor are deposited, after definition, the whole structure of gate is completed. However, ion implantation is not operated until the gate oxide is well formed, the direct bombardment of ions unto the gate oxide will cause tremendous damage to its surface. Moreover, the dopants of polysilicon and the by-products when depositing silicide will penetrate into the gate oxide during the following manufacturing processes. All these factors are going to definitely damage the gate structure, then satisfactory electrical characteristics of a transistor are hardly to find.

Although the conventional technology offers an improved method to better the mentioned drawbacks, but some other side effects still result in the damage of the gate property. It is working in this way: starting channel ion implantation before forming the gate oxide. But what worse is that the high temperature up to higher than 800 degree C while forming the gate oxide will further induce the spreading out of the doped ions, even into the substrate or the gate oxide. Once happened, it gets more difficult to control the impurity density, and further, the property of the gate oxide will be exceedingly damaged, thus the expression of whole transistor is unavoidably degraded.

SUMMARY OF THE INVENTION

It is therefore the object of this invention to improve the property of the gate oxide, thus stabilize the electric properties of transistor and enhance its yield. This goal has been achieved by adding an amorphous silicon layer after forming the gate oxide and ahead of ion implantation for the channel.

The object of the present invention is accomplished by the process described below. First, a layer of amorphous silicon is deposited after forming the gate oxide, and ion implantation for forming channel is performed, then a doped polysilicon layer and a silicide layer are deposited orderly, finally the whole structure is defined to form a gate electrode. The key point of the current invention is the addition of amorphous silicon. This amorphous silicon can prevent the direct bombardment of implanted ions to the gate oxide, it can also avoid the diffusion of polysilicon dopant into the gate oxide, therefore, the electrical properties of transistor will be made stable. In addition, the native oxide spontaneously produced between amorphous silicon and polysilicon along with process is very even and plain, it is profitable to planarization when subsequently depositing other layers.

DETAILED DESCRIPTION OF THE EMBODIMENT

Figure 1:
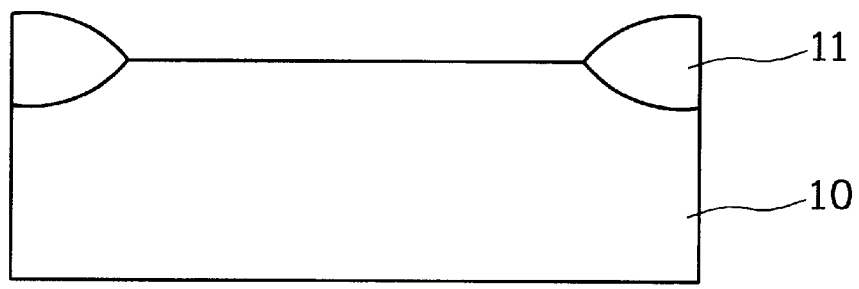
FIG. 1 is a cross-section view of the substrate on which the isolation process has been finished according to the present invention.

In the following embodiment, NMOS is taken as an example to present how a channel is formed according to the present invention. As shown in FIG. 1, the isolation process as one technology used to prevent transistors form short each other is performed on the substrate 10. The isolation process in the present invention can be either local oxidation (LOCOS) or trench isolation. The isolation area 11 in FIG. 1 is silicon dioxide ($SiO_2$) layer with the thickness of several thousand angstroms and formed by local oxidation.

Figure 2:
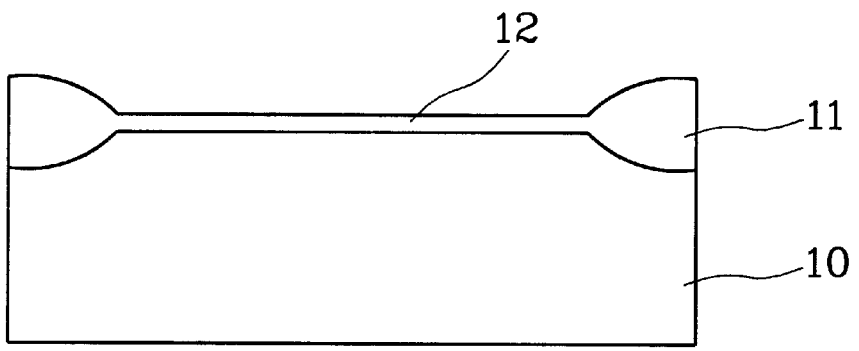
FIG. 2 is a cross-section view of the substrate on which a gate oxide has been subsequently formed according to the present invention.

Next, a thin film of gate oxide 12 as the oxide part of a NMOS transistor is subsequently formed in the active area as shown in FIG. 2. The active area is actually part of the substrate surface which has not been oxidized and is the position ready for NMOS to be built in. The gate oxide is a silicon dioxide layer with the thickness between 20 angstroms to 250 angstroms and formed by oxidizing the substrate silicon.

Figure 3:
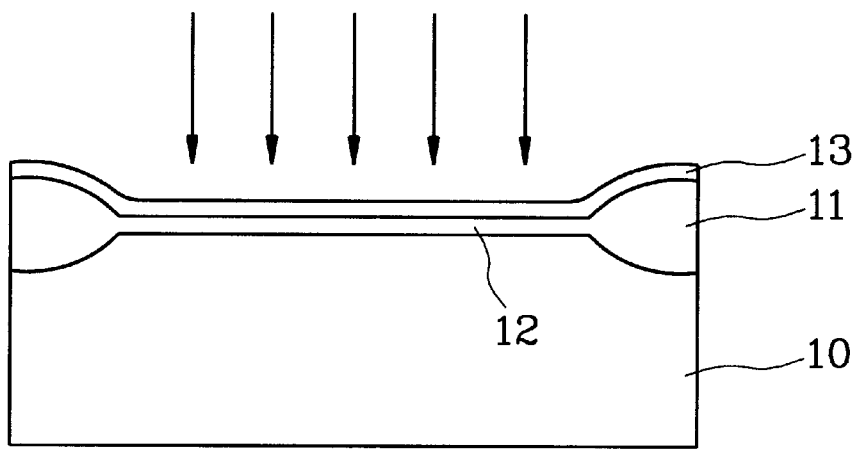
FIG. 3 is a cross-section view of the substrate on which an amorphous silicon layer has been subsequently formed, and ion implantation is thereafter performed according to the present invention.

Referring now to FIG. 3, an amorphous silicon layer 13 with the thickness between 200 angstroms to 500 angstroms is formed over the gate oxide layer 12. The amorphous silicon with non-regular crystal orientation can be formed by low pressure chemical vapor deposition (LPCVD) with the reactants of silane ($SiH_4$) and dislane ($Si_2H_6$) at the temperature between 470° C. to 550° C.

The following step is ion implantation of an N-channel 14 for controlling the threshold voltage by regulating the substrate density. The impurity of boron (B) or boron-difluoride ($BF_2$) is doped into the p-type substrate with the dose between 10E12 to 10E14 $cm^{-2}$ and the energy between 20–50 KeV. Now, because the very amorphous silicon 13 are covered the gate oxide 12, the implanted ions will not bombard the gate oxide directly, therefore the gate oxide is free from damage.

Before depositing the gate electrode, pre-cleaning for clearing up particles, especially the organic particles has to be done firstly. APM, hydrofluoric acid (HF) and hydrogen peroxide ($H_2O_2$) are used in the present invention to do this. APM is a solution of ammonia aqua($NH_4OH$), $H_2$ hydrogen peroxide ($H_2O_2$), and water proportionally mixed with the ratio 1:4:20. The pre-cleaning solution used in the present invention has the characteristic of being able to work at low temperatures, thus the diffusion of dopants in chip will not be induced.

Figure 4:
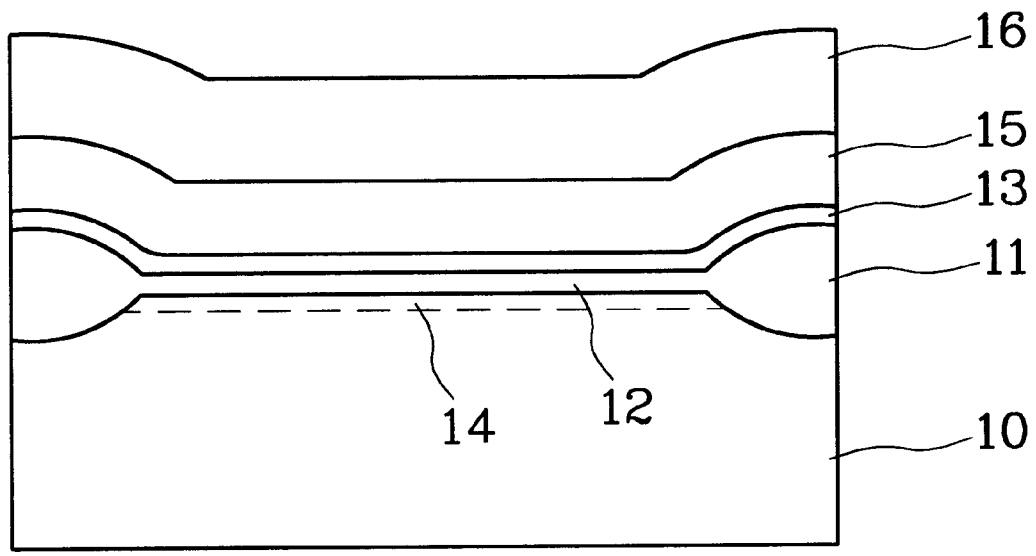
FIG. 4 is a cross-section view of the substrate on which a polysilicon layer and a silicide layer have been subsequently formed orderly according to the present invention.
Figure 5:
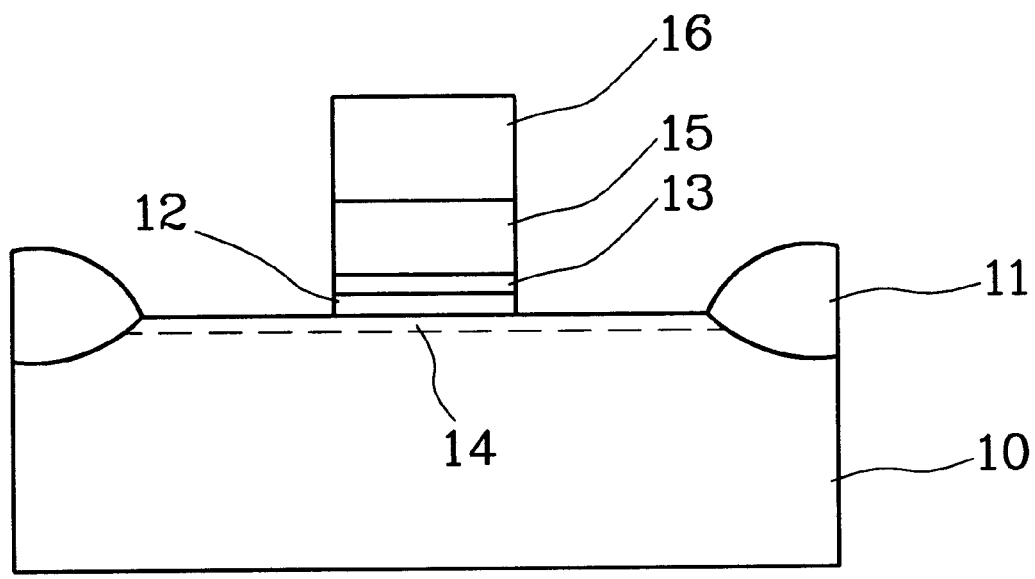
FIG. 5 is a cross-section view of the gate structure after the definition of the substrate on which all the foregoing steps have been well done according to the present invention.

Referring now to FIG. 4 and FIG. 5, the following steps are to deposit the gate electrode in which a polysilicon layer 15 and a refractory metal silicide layer 16 are included. The resistance of heavily doped polysilicon could be shrunk to the range between 500 to 1200 $\mu\Omega$-cm, thus it will be suitable for conductor. The polysilicon 14 is formed by low pressure chemical deposition (LPCVD), and with the reaction of silane ($SiH_4$) decomposition at the temperature between 470° C. to 550° C. And the doping of polysilicon is through in-situ deposition, or by impurity driving in after deposition, or by ion implanting with phosphorous (P) or arsenic (As) as dopant. The using of refractory metal silicide and polysilicon can further reduce the resistance of the gate, in which tungsten silicide ($WSi_x$, x=2.6~2.8) is most preferable. Tungsten silicide is formed by taking tungsten hexifluoride ($WF_6$) as source and reacted with silane ($SiH_4$) through chemical vapor deposition at temperature ranging from 300° C. to 400° C.

In this invention, an layer of amorphous silicon 13 is deposited under the gate electrode, specifically, as a barrier layer, to prevent the dopants and fluorine atoms which are the by-product in depositing polysilicon from diffusing into the gate oxide. It is also this barrier layer doing the job of avoiding the direct bombarding of ions to the gate oxide. Therefore, both the charge-to-break and the break down voltage increase, that is, the electric properties of the transistor have been made far more stable due to less impurity in the gate oxide. In addition, an extremely thin layer of native oxide will be produced between amorphous silicon and polysilicon along with the manufacturing progress. This native oxide can work as another barrier layer to stop dopants and fluorine atoms diffusing into the gate oxide. Further, being very even and plain upon amorphous silicon, this native oxide can help planarization of the following layers when depositing.

It may thus be seen that the objects of the present invention set forth herein, as well as those made apparent from the foregoing description, are efficiently attained. While the preferred embodiment of the invention has been set forth for purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A method for forming the gate electrode in integrated circuits, comprising the steps of:
    (a) forming isolation regions on a semiconductor substrate in integrated circuits;
    (b) forming a gate oxide layer on said semiconductor substrate;
    (c) forming a amorphous silicon layer on said gate oxide layer;
    (d) performing ion implantation unto said substrate to form a n-channel;
    (e) forming a gate electrode layer over said amorphous silicon layer in said n-channel region; and
    (f) defining a gate electrode by patterning said gate electrode layer, amorphous layer and gate oxide layer.

2. The method according to claim 1, further comprising a step of pre-cleaning prior to step (e).

3. The method according to claim 2, wherein said pre-cleaning is performed with a mixed solution of APM, hydrofluoric acid (HF), and hydrogen peroxide ($H_2O_2$), wherein said APM is a mixed solution of ammonia aqua ($NH_4OH$), hydrogen peroxide ($H_2O_2$) and water ($H_2O$).

4. The method according to claim 1, wherein said isolation regions are formed by local oxidation (LOCOS).

5. The method according to claim 1, wherein said isolation regions are formed by trench isolation.

6. The method according to claim 1, wherein said gate oxide layer has a thickness between 20 angstroms to 250 angstroms.

7. The method according to claim 1, wherein said amorphous silicon layer is formed by low pressure chemical vapor deposition (LPCVD).

8. The method according to claim 7, wherein said amorphous silicon layer is deposited in a temperature range of 470° C. to 550° C.

9. The method according to claim 1, wherein said amorphous silicon layer has a thickness between 200 angstroms to 500 angstroms.

10. The method according to claim 1, wherein said ion implantation is implanted boron (B) ions.

11. The method according to claim 1, wherein said ion implantation is implanted boron difluoride ($BF_2$) ions.

12. The method according to claim 1, wherein said gate electrode layer is composed of polysilicon and metal silicide layers.

13. The method according to claim 12, wherein said metal silicide layer is refractory metal silicide.

14. The method according to claim 13, wherein said refractory metal silicide is tungsten silicide.

15. The method according to claim 14, wherein said tungsten silicide is formed by chemical vapor deposition.

16. The method according to claim 15, wherein said tungsten silicide is formed under reactants of tungsten hexafluoride ($WF_6$) and silane ($SiH_4$).

17. The method according to claim 15, wherein said tungsten silicide is deposited in a temperature range of 470° C. to 550° C.

* * * * *